United States Patent
Hsu et al.

(10) Patent No.: US 11,664,214 B2
(45) Date of Patent: *May 30, 2023

(54) METHODS FOR PRODUCING HIGH-DENSITY, NITROGEN-DOPED CARBON FILMS FOR HARDMASKS AND OTHER PATTERNING APPLICATIONS

(71) Applicant: Applied Materials, Inc., Santa Clara, CA (US)

(72) Inventors: Jui-Yuan Hsu, Santa Clara, CA (US); Pramit Manna, Santa Clara, CA (US); Karthik Janakiraman, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 183 days.

This patent is subject to a terminal disclaimer.

(21) Appl. No.: 17/035,192

(22) Filed: Sep. 28, 2020

(65) Prior Publication Data

US 2021/0407791 A1    Dec. 30, 2021

Related U.S. Application Data

(63) Continuation-in-part of application No. 16/915,110, filed on Jun. 29, 2020.

(51) Int. Cl.
| | | |
|---|---|---|
| H01L 21/02 | (2006.01) | |
| C23C 16/27 | (2006.01) | |
| H01L 21/033 | (2006.01) | |

(52) U.S. Cl.
CPC ...... *H01L 21/02115* (2013.01); *C23C 16/272* (2013.01); *H01L 21/02274* (2013.01);
(Continued)

(58) Field of Classification Search
None
See application file for complete search history.

(56) References Cited

U.S. PATENT DOCUMENTS

| | | | |
|---|---|---|---|
| 4,783,368 | A | 11/1988 | Yamamoto et al. |
| 5,352,493 | A | 10/1994 | Dorfman et al. |
| (Continued) | | | |

FOREIGN PATENT DOCUMENTS

| | | |
|---|---|---|
| JP | 2010024476 A | 2/2010 |
| KR | 20110115291 A | 10/2011 |
| (Continued) | | |

OTHER PUBLICATIONS

Zhou et al., "Structural characterization of nitrogen doped diamond-like carbon films deposited by arc ion plating", Applied Surface Science, vol. 241, Issues 3-4, Mar. 15, 2005, pp. 295-302. (Year: 2005).*

(Continued)

*Primary Examiner* — Asok K Sarkar
(74) *Attorney, Agent, or Firm* — Patterson + Sheridan, LLP

(57) ABSTRACT

Embodiments of the present disclosure generally relate to the fabrication of integrated circuits. More particularly, the embodiments described herein provide techniques for depositing nitrogen-doped diamond-like carbon films for patterning applications. In one or more embodiments, a method for processing a substrate includes flowing a deposition gas containing a hydrocarbon compound and a nitrogen dopant compound into a processing volume of a process chamber having a substrate positioned on an electrostatic chuck, and generating a plasma at or above the substrate by applying a first RF bias to the electrostatic chuck to deposit a nitrogen-doped diamond-like carbon film on the substrate. The nitrogen-doped diamond-like carbon film has a density (Continued)

of greater than 1.5 g/cc and a compressive stress of about −20 MPa to less than −600 MPa.

20 Claims, 6 Drawing Sheets

(52) U.S. Cl.
CPC ...... *H01L 21/0332* (2013.01); *H01L 21/0337* (2013.01); *H01L 21/02337* (2013.01)

(56) References Cited

U.S. PATENT DOCUMENTS

| | | | |
|---|---|---|---|
| 5,378,316 A | 1/1995 | Franke et al. |
| 5,688,382 A | 11/1997 | Besen et al. |
| 5,711,773 A | 1/1998 | Selifanov et al. |
| 5,942,854 A | 8/1999 | Ryoji et al. |
| 5,965,217 A | 10/1999 | Sugiyama et al. |
| 6,013,980 A | 1/2000 | Goel et al. |
| 6,235,851 B1 | 5/2001 | Ishii et al. |
| 6,320,295 B1 | 11/2001 | McGill et al. |
| 6,592,771 B1 | 7/2003 | Yamanaka et al. |
| 6,740,393 B1 | 5/2004 | Massler et al. |
| 6,749,813 B1 | 6/2004 | David et al. |
| 6,900,002 B1 | 5/2005 | Plat et al. |
| 6,930,048 B1 | 8/2005 | Li et al. |
| 7,166,336 B1 | 1/2007 | Mori et al. |
| 7,268,846 B2 | 9/2007 | Hwang et al. |
| 7,824,498 B2 | 11/2010 | Parkhe et al. |
| 7,942,111 B2 | 5/2011 | Burger et al. |
| 8,105,660 B2 | 1/2012 | Tudhope et al. |
| 8,119,240 B2 | 2/2012 | Cooper |
| 8,361,906 B2 | 1/2013 | Lee et al. |
| 8,547,006 B1 | 10/2013 | Ives et al. |
| 8,852,348 B2 | 10/2014 | Parkhe et al. |
| 9,269,587 B2 | 2/2016 | Shimizu et al. |
| 9,305,802 B2 | 4/2016 | Kim et al. |
| 9,362,292 B1 | 6/2016 | Liaw |
| 9,520,295 B2 | 12/2016 | Shaikh et al. |
| 9,695,593 B2 | 7/2017 | Vokey et al. |
| 10,249,495 B2 | 4/2019 | Yang et al. |
| 10,366,973 B2 | 7/2019 | Cho et al. |
| 10,544,505 B2 | 1/2020 | Yang et al. |
| 10,745,282 B2 | 8/2020 | Venkatasubramanian et al. |
| 10,954,129 B2 | 3/2021 | Koshizawa et al. |
| 11,043,372 B2 | 6/2021 | Venkatasubramanian et al. |
| 11,043,375 B2 | 6/2021 | Yang et al. |
| 11,062,897 B2 | 7/2021 | Yu et al. |
| 2002/0039626 A1 | 4/2002 | Nakahigashi et al. |
| 2003/0035905 A1 | 2/2003 | Lieberman et al. |
| 2003/0180459 A1 | 9/2003 | Redeker et al. |
| 2003/0229412 A1 | 12/2003 | White et al. |
| 2004/0000534 A1 | 1/2004 | Lipinski |
| 2004/0026235 A1 | 2/2004 | Stowell |
| 2004/0157059 A1 | 8/2004 | Hayashi |
| 2005/0253901 A1 | 11/2005 | Miller, Jr. |
| 2006/0093803 A1 | 5/2006 | Hwang et al. |
| 2006/0228479 A1 | 10/2006 | Dahl et al. |
| 2006/0246290 A1 | 11/2006 | Oda et al. |
| 2006/0264063 A1 | 11/2006 | Stern et al. |
| 2007/0104867 A1 | 5/2007 | Haba |
| 2007/0275569 A1 | 11/2007 | Moghadam et al. |
| 2008/0053819 A1 | 3/2008 | Hong et al. |
| 2008/0085604 A1 | 4/2008 | Hoshino et al. |
| 2008/0099326 A1 | 5/2008 | Ye et al. |
| 2008/0194169 A1 | 8/2008 | Sterling et al. |
| 2009/0029067 A1 | 1/2009 | Sciamanna et al. |
| 2009/0047760 A1 | 2/2009 | Yamazaki et al. |
| 2009/0186206 A1 | 7/2009 | Ito et al. |
| 2009/0212010 A1 | 8/2009 | Wang et al. |
| 2009/0307649 A1 | 12/2009 | Pramanik et al. |
| 2011/0003087 A1 | 1/2011 | Soininen et al. |
| 2011/0005681 A1 | 1/2011 | Savas et al. |
| 2011/0017424 A1 | 1/2011 | Parkhe et al. |
| 2011/0195196 A1 | 8/2011 | Kim |
| 2011/0244142 A1 | 10/2011 | Cheng et al. |
| 2011/0274852 A1 | 11/2011 | Ito et al. |
| 2012/0276743 A1 | 11/2012 | Won et al. |
| 2013/0146443 A1 | 6/2013 | Papa et al. |
| 2014/0054658 A1 | 2/2014 | Ma et al. |
| 2014/0170853 A1 | 6/2014 | Shamma et al. |
| 2014/0335700 A1 | 11/2014 | Denifl et al. |
| 2014/0345802 A1 | 11/2014 | Umehara et al. |
| 2014/0370711 A1 | 12/2014 | Cheng et al. |
| 2015/0200094 A1 | 7/2015 | Underwood et al. |
| 2015/0348824 A1 | 12/2015 | Kuenle et al. |
| 2015/0371851 A1 | 12/2015 | Lee et al. |
| 2016/0042961 A1 | 2/2016 | Dorf et al. |
| 2016/0053366 A1 | 2/2016 | Stowell et al. |
| 2016/0086794 A9 | 3/2016 | Cheng et al. |
| 2016/0147141 A1 | 5/2016 | Ono et al. |
| 2016/0149128 A1 | 5/2016 | Bodke et al. |
| 2016/0179005 A1 | 6/2016 | Shamma et al. |
| 2016/0225632 A1 | 8/2016 | Shaikh et al. |
| 2016/0276134 A1 | 9/2016 | Collins et al. |
| 2016/0372307 A1 | 12/2016 | Yang et al. |
| 2017/0103893 A1 | 4/2017 | Kulshreshtha et al. |
| 2017/0372899 A1 | 12/2017 | Yang et al. |
| 2018/0274089 A1 | 9/2018 | Yang et al. |
| 2018/0274100 A1 | 9/2018 | Yang et al. |
| 2018/0277340 A1 | 9/2018 | Yang et al. |
| 2018/0354804 A1 | 12/2018 | Venkatasubramanian et al. |
| 2018/0358222 A1 | 12/2018 | Venkatasubramanian et al. |
| 2018/0358229 A1 | 12/2018 | Koshizawa et al. |
| 2019/0057862 A1 | 2/2019 | Yang et al. |
| 2019/0228970 A1 | 7/2019 | Yang et al. |
| 2019/0385907 A1 | 12/2019 | Gottheim et al. |
| 2020/0331762 A1 | 10/2020 | Venkatasubramanian et al. |

FOREIGN PATENT DOCUMENTS

| | | |
|---|---|---|
| KR | 20120121340 A | 11/2012 |
| TW | 468209 B | 12/2001 |

OTHER PUBLICATIONS

International Search Report dated Sep. 5, 2018 for Application No. PCT/US2018/032684.

Ban et al. "Diamond-like carbon films deposited by electron beam excited plasma chemical vapor deposition," Diamond and Related Materials, vol. 11, No. 7, Jul. 2002, pp. 1353-1359, <https://doi.org/10.1016/S0925-9635(01)00743-9>.

Ban et al. "Stress and structural properties of diamond-like carbon films deposited by electron beam excited plasma CVD," Diamond and Related Materials, vol. 12, No. 1, Jan. 2003, pp. 47-56, <https://doi.org/10.1016/S0925-9635(02)00265-0>.

International Search Report and Written Opinion dated Sep. 30, 2021 for Application No. PCT/US2021/036188.

International Search Report and Written Opinion dated Sep. 29, 2021 for Application No. PCT/US2021/036195.

International Search Report and Written Opinion dated Sep. 30, 2021 for Application No. PCT/US2021/036114.

Moushinho et al. "High density plasma chemical vapor deposition of diamond-like carbon films," Microelectronics Journal, vol. 34, Nos. 5-8, May-Aug. 2003, pp. 627-629, <https://doi.org/10.1016/S0026-2692(03)00065-X>.

Ferrari et al., "Stress reduction and bond stability during thermal annealing of tetrahedral amorphous carbon", J. Appl. Phys., vol. 85, No. 10, May 15, 1999; 7 pages.

Zhu et al., "Modulationg Band Gap of Boron Doping in Amorphous Carbon Nano-Film", Materials May 31, 2019; 12, 1780; 9 pages.

\* cited by examiner

METHODS FOR PRODUCING HIGH-DENSITY, NITROGEN-DOPED CARBON FILMS FOR HARDMASKS AND OTHER PATTERNING APPLICATIONS

CROSS-REFERENCE TO RELATED APPLICATIONS

This application is a continuation-in-part of U.S. application Ser. No. 16/915,110, filed Jun. 29, 2020, which is herein incorporated by reference.

BACKGROUND

Field

Embodiments of the present disclosure generally relate to the fabrication of integrated circuits. More particularly, the embodiments described and discussed herein provide techniques for the deposition of high-density films for patterning applications.

Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components reduce to the sub-micron scale, it is now necessary to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer step due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are desirable. As critical dimensions (CD) decrease, current hardmask materials lack the desired etch selectivity relative to underlying materials (e.g., oxides and nitrides) and are often difficult to deposit.

Therefore, there is a need in the art for an improved hardmask layers and methods for depositing improved hardmask layers.

SUMMARY

Embodiments of the present disclosure generally relate to the fabrication of integrated circuits. More particularly, the embodiments described and discussed herein provide techniques for the deposition of high-density films, such as nitrogen-doped diamond-like carbon films, for patterning applications. In one or more embodiments, a method of processing a substrate includes flowing a deposition gas containing a hydrocarbon compound and a nitrogen dopant compound into a processing volume of a process chamber having a substrate positioned on an electrostatic chuck, and generating a plasma at or above the substrate by applying a first RF bias to the electrostatic chuck to deposit a nitrogen-doped diamond-like carbon film on the substrate. The nitrogen-doped diamond-like carbon film has a density of greater than 1.5 g/cc and a compressive stress of about −20 MPa to less than −600 MPa. In some examples, the nitrogen-doped diamond-like carbon film has a density of greater than 1.5 g/cc to about 2.1 g/cc and a compressive stress of about −200 MPa to less than −600 MPa.

In some embodiments, a method of processing a substrate includes flowing a deposition gas containing a hydrocarbon compound and a nitrogen dopant compound into a processing volume of a process chamber having a substrate positioned on an electrostatic chuck, where the electrostatic chuck has a chucking electrode and an RF electrode separate from the chucking electrode, and the processing volume is maintained at a pressure of about 0.5 mTorr to about 10 Torr. The method further includes generating a plasma above the substrate by applying a first RF bias to the RF electrode and a second RF bias to the chucking electrode to deposit a nitrogen-doped diamond-like carbon film on the substrate. The nitrogen-doped diamond-like carbon film contains about 0.1 atomic percent to about 20 atomic percent of nitrogen and about 50 atomic percent to about 90 atomic percent of spa hybridized carbon atoms, and has a density of greater than 1.5 g/cc and a compressive stress of about −20 MPa to less than −600 MPa.

In other embodiments, a method of processing a substrate includes flowing a deposition gas containing a hydrocarbon compound and a nitrogen dopant compound into a processing volume of a process chamber having a substrate positioned on an electrostatic chuck, where the electrostatic chuck has a chucking electrode and an RF electrode separate from the chucking electrode, and the processing volume is maintained at a pressure of about 0.5 mTorr to about 10 Torr. The method also includes generating a plasma above the substrate by applying a first RF bias to the RF electrode and a second RF bias to the chucking electrode to deposit a nitrogen-doped diamond-like carbon film on the substrate. The nitrogen-doped diamond-like carbon film contains about 0.1 atomic percent to about 20 atomic percent of nitrogen, and has a density of greater than 1.5 g/cc and a compressive stress of about −20 MPa to less than −600 MPa. The method further includes forming a patterned photoresist layer over the nitrogen-doped diamond-like carbon film, etching the nitrogen-doped diamond-like carbon film in a pattern corresponding with the patterned photoresist layer, and etching the pattern into the substrate.

In one or more embodiments, a nitrogen-doped diamond-like carbon film for use as an underlayer for an extreme ultraviolet ("EUV") lithography process is provided and contains about 0.1 atomic percent to about 20 atomic percent of nitrogen and about 50 atomic percent to about 90 atomic percent or about 60 atomic percent to about 70 atomic percent of spa hybridized carbon atoms. The nitrogen-doped diamond-like carbon film has a density of greater than 1.5 g/cc to about 2.1 g/cc, about 1.55 g/cc to less than 2 g/cc, or about 1.6 g/cc to about 1.8 g/cc and a compressive stress of about −20 MPa to less than −600 MPa, about −200 MPa to about −500 MPa, or about −250 MPa to about −400 MPa.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of scope, for the disclosure may admit to other equally effective implementations.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
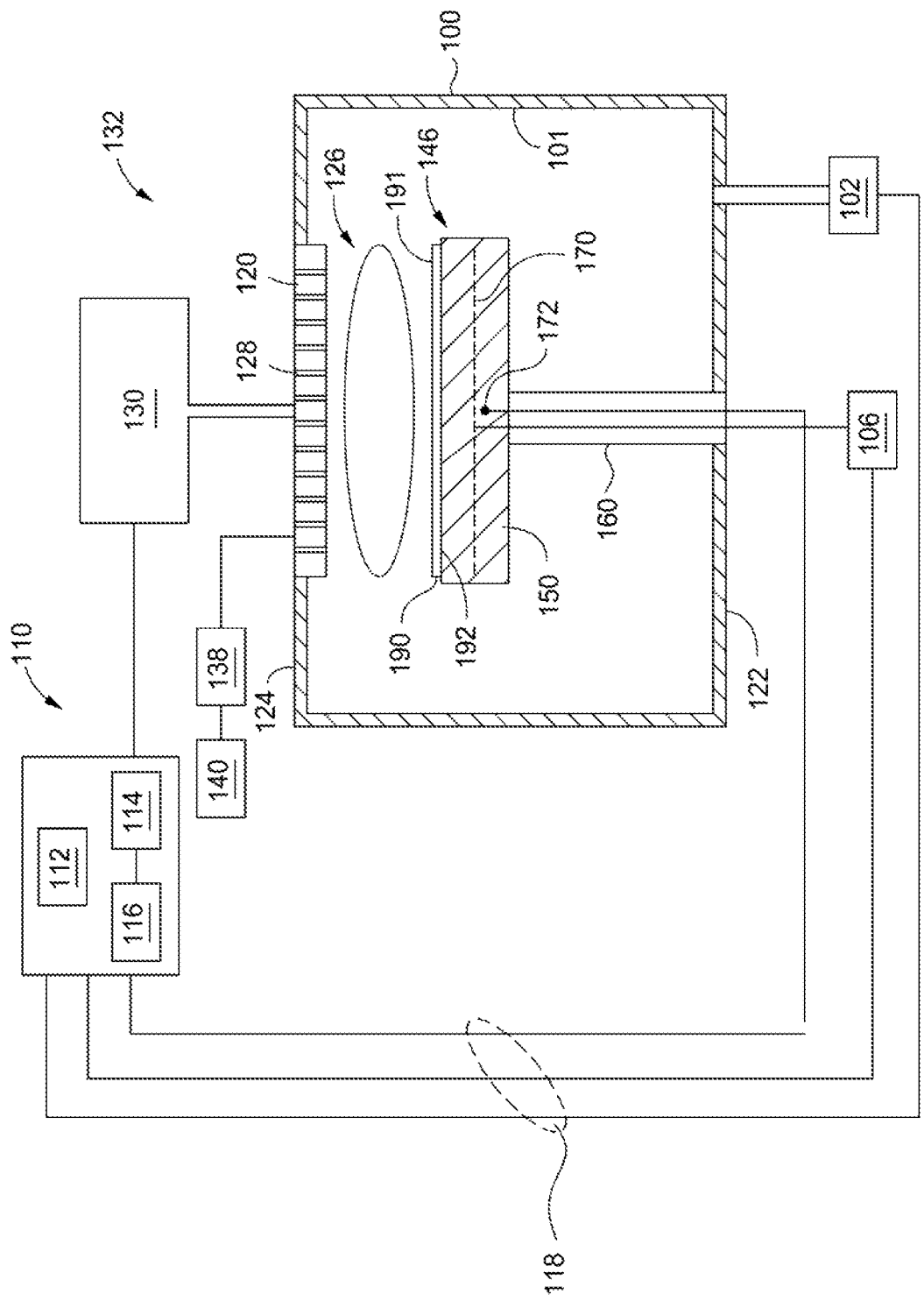
FIG. 1A depicts a schematic cross-sectional view of a deposition system that can be used to practice processes according to one or more embodiments described and discussed herein.

Embodiments provided herein relate to nitrogen-doped diamond-like carbon films and methods for depositing or otherwise forming the nitrogen-doped diamond-like carbon films on a substrate. Certain details are set forth in the following description and in FIGS. 1A-5 to provide a thorough understanding of various embodiments of the disclosure. Other details describing well-known structures and systems often associated with plasma processing and diamond-like carbon film deposition are not set forth in the following disclosure to avoid unnecessarily obscuring the description of the various embodiments.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

Embodiments described herein, include improved methods of fabricating nitrogen-doped diamond-like carbon films with high-density (e.g., >1.5 g/cc), high elastic modulus (e.g., >60 GPa), and low compressive stress (e.g., <−500 MPa). The nitrogen-doped diamond-like carbon films fabricated according to the embodiments described herein are amorphous in nature and have a greater etch selectivity along with lower stress than current patterning films. The nitrogen-doped diamond-like carbon films fabricated according to the embodiments described herein not only have a low compressive stress but also have a high spa carbon content. In general, the deposition process described herein is also fully compatible with current integration schemes for hardmask applications.

In one or more embodiments, the nitrogen-doped diamond-like carbon films described herein may be formed by chemical vapor deposition (CVD), such as plasma enhanced CVD and/or thermal CVD processes, using a deposition gas containing one or more hydrocarbon compounds and one or more nitrogen dopant compounds. In one or more examples, a deposition gas containing one or more hydrocarbon compounds, one or more nitrogen dopant compounds, and optionally one or more dilution gases can be flowed or otherwise introduced into a processing volume of a process chamber. A substrate is positioned or otherwise disposed on an electrostatic chuck within the processing volume, where the electrostatic chuck has a chucking electrode and an RF electrode separate from the chucking electrode. The method further includes generating a plasma at and/or above the substrate by applying a first RF bias to the RF electrode and a second RF bias to the chucking electrode to deposit a nitrogen-doped diamond-like carbon film on the substrate.

Embodiments described and discussed herein will be discussed in reference to a plasma-enhanced chemical vapor deposition (PE-CVD) process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. Other tools capable of performing PE-CVD processes may also be adapted to benefit from the embodiments described herein. In addition, any system enabling the PE-CVD processes described herein can be used to advantage. The apparatus description described herein is illustrative and should not be construed or interpreted as limiting the scope of the embodiments described herein.

Exemplary hydrocarbon compounds can be or include ethyne or acetylene ($C_2H_2$), propene ($C_3H_6$), methane ($CH_4$), butene ($C_4H_8$), 1,3-dimethyladamantane, bicyclo [2.2.1]hepta-2,5-diene (2,5-norbornadiene), adamantine ($C_{10}H_{16}$), norbornene ($C_7H_{10}$), derivatives thereof, isomers thereof, or any combination thereof. Exemplary nitrogen dopant compounds can be or include dinitrogen ($N_2$), atomic nitrogen, ammonia, hydrazine, methylhydrazine, dimethlyhydrazine, t-butylhydrazine, phenylhydrazine, azoisobutane, ethylazide, pyridine, derivatives thereof, abducts thereof, or any combination thereof. The deposition gas may further include one, two, or more dilution gases, carrier gases, and/or purge gases, such as, for example, helium, argon, xenon, neon, nitrogen ($N_2$), hydrogen ($H_2$), or any combination thereof. In some examples, the deposition gas may further include etchant gases such as chlorine ($Cl_2$), carbon tetrafluoride ($CF_4$), and/or nitrogen trifluoride ($NF_3$) to improve film quality.

The substrate and/or the processing volume can be heated and maintained at independent temperatures during the deposition process. The substrate and/or the processing volume can be heated to a temperature of about −50° C., about −40° C., about −25° C., about −10° C., about −5° C., about 0° C., about 5° C., or about 10° C. to about 15° C., about 20° C., about 23° C., about 30° C., about 50° C., about 100° C., about 150° C., about 200° C., about 300° C., about 400° C., about 500° C., or about 600° C. For example, the substrate and/or the processing volume can be heated to a temperature of about −50° C. to about 600° C., about −50° C. to about 450° C., about −50° C. to about 350° C., about −50° C. to about 200° C., about −50° C. to about 100° C., about −50° C. to about 50° C., about −50° C. to about 0° C., about −40° C. to about 200° C., about −40° C. to about 100° C., about −40° C. to about 80° C., about −40° C. to about 50° C., about −40° C. to about 25° C., about −40° C. to about 10° C., about −40° C. to about 0° C., about 0° C. to about 600° C., about 0° C. to about 450° C., about 0° C. to about 350° C., about 0° C. to about 200° C., about 0° C. to about 120° C., about 0° C. to about 100° C., about 0° C. to about 80° C., about 0° C. to about 50° C., about 0° C. to about 25° C., about 10° C. to about 600° C., about 10° C. to about 450° C., about 10° C. to about 350° C., about 10° C. to about 200° C., about 10° C. to about 100° C., or about 10° C. to about 50° C.

The processing volume of the processing chamber is maintained at sub-atmospheric pressures during the deposition process. The processing volume of the processing chamber is maintained at a pressure of about 0.1 mTorr, about 0.5 mTorr, about 1 mTorr, about 5 mTorr, about 10 mTorr, about 50 mTorr, or about 80 mTorr to about 100 mTorr, about 250 mTorr, about 500 mTorr, about 1 Torr, about 5 Torr, about 10 Torr, about 20 Torr, about 50 Torr, or about 100 Torr. For example, the processing volume of the processing chamber is maintained at a pressure of about 0.1 mTorr to about 10 Torr, about 0.1 mTorr to about 5 Torr, about 0.1 mTorr to about 1 Torr, about 0.1 mTorr to about 500 mTorr, about 0.1 mTorr to about 100 mTorr, about 0.1 mTorr to about 10 mTorr, about 1 mTorr to about 10 Torr, about 1 mTorr to about 5 Torr, about 1 mTorr to about 1 Torr, about 1 mTorr to about 500 mTorr, about 1 mTorr to about 100 mTorr, about 1 mTorr to about 10 mTorr, about 5 mTorr to about 10 Torr, about 5 mTorr to about 5 Torr, about 5 mTorr to about 1 Torr, about 5 mTorr to about 500 mTorr, about 5 mTorr to about 100 mTorr, or about 5 mTorr to about 10 mTorr. In one or more examples, the processing volume is maintained at a pressure of about 0.5 mTorr to about 10 Torr, about 1 mTorr to about 500 mTorr, or about 5 mTorr to about 100 mTorr when generating the plasma and depositing the nitrogen-doped diamond-like carbon film on a substrate maintained at a temperature of about 0° C. to about 50° C.

The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, about 350 KHz, about 2 MHz, about 13.56 MHz, about 27 MHz, about 40 MHz, about 60 MHz, and about 100 MHz, being used alternatively or simultaneously in a CVD system with any or all of the reactant gases listed herein to deposit a thin film of diamond-like carbon for use as a hardmask and/or etch stop or any other application requiring smooth carbon films. The high etch selectivity of the nitrogen-doped diamond-like carbon film is achieved by having greater density and modulus than current generation films. Not to be bound by theory but it is believed that the greater density and modulus are a result of the high content of spa hybridized carbon atoms in the nitrogen-doped diamond-like carbon film, which in turn may be achieved by a combination of low pressure and plasma power.

In one or more embodiments, the nitrogen-doped diamond-like carbon film is deposited in a process chamber with the substrate pedestal maintained at about 10° C. and a pressure at about 2 mTorr, with plasma generated at or above the substrate level by applying a bias of about 2,500 watts (about 13.56 MHz) to the electrostatic chuck. In other embodiments, an additional RF of about 1,000 watts at about 2 MHz is also delivered to the electrostatic chuck thus generating a dual-bias plasma at the substrate level.

In one or more embodiments, hydrogen radical are fed through an RPS, which leads to selective etching of $sp^2$ hybridized carbon atoms thus increasing the $sp^3$ hybridized carbon atom fraction of the film further, thus further increasing the etch selectivity. The nitrogen-doped diamond-like carbon film can have a concentration or percentage of $sp^3$ hybridized carbon atoms (e.g., a $sp^3$ hybridized carbon atom content) that is at least 40 atomic percent (at %), about 45 at %, about 50 at %, about 55 at %, or about 58 at % to about 60 at %, about 65 at %, about 70 at %, about 75 at %, about 80 at %, about 85 at %, about 88 at %, about 90 at %, about 92 at %, or about 95 at %, based on the total amount of carbon atoms in the nitrogen-doped diamond-like carbon film. For example, the nitrogen-doped diamond-like carbon film can have a concentration or percentage of $sp^3$ hybridized carbon atoms that is at least 40 at % to about 95 at %, about 45 at % to about 95 at %, about 50 at % to about 95 at %, about 50 at % to about 90 at %, about 50 at % to about 85 at %, about 50 at % to about 80 at %, about 50 at % to about 75 at %, about 50 at % to about 70 at %, about 50 at % to about 65 at %, about 55 at % to about 75 at %, about 55 at % to about 70 at %, about 55 at % to about 65 at %, about 55 at % to about 60 at %, about 60 at % to about 80 at %, about 60 at % to about 75 at %, about 60 at % to about 70 at %, about 60 at % to about 65 at %, about 65 at % to about 95 at %, about 65 at % to about 90 at %, about 65 at % to about 85 at %, about 65 at % to about 80 at %, about 65 at % to about 75 at %, about 65 at % to about 70 at %, about 65 at % to about 68 at %, about 75 at % to about 95 at %, about 75 at % to about 90 at %, about 75 at % to about 85 at %, about 75 at % to about 80 at %, or about 75 at % to about 78 at %, based on the total amount of carbon atoms in the nitrogen-doped diamond-like carbon film.

In some embodiments, the nitrogen-doped diamond-like carbon film can have a concentration or percentage of $sp^2$ hybridized carbon atoms (e.g., a $sp^2$ hybridized carbon atom content) that is less than 60 at %, such as less than 55 at % or less than 50 at %. The nitrogen-doped diamond-like carbon film can have a concentration or percentage of $sp^2$ hybridized carbon atoms that is about 5 at %, about 10 at %, about 15 at %, about 20 at %, about 25 at %, about 28 at %, or about 30 at % to about 32 at %, about 35 at %, about 36 at %, about 38 at %, about 40 at %, about 45 at %, about 50 at %, about 55 at %, or about 60 at %, based on the total amount of carbon atoms in the nitrogen-doped diamond-like carbon film. For example, the nitrogen-doped diamond-like carbon film can have a concentration or percentage of $sp^2$ hybridized carbon atoms that is about 5 at % to about 60 at %, about 5 at % to about 50 at %, about 5 at % to about 45 at %, about 5 at % to about 40 at %, about 5 at % to about 38 at %, about 5 at % to about 36 at %, about 5 at % to about 35 at %, about 5 at % to about 32 at %, about 5 at % to about 30 at %, about 5 at % to about 25 at %, about 5 at % to about 20 at %, about 5 at % to about 15 at %, about 5 at % to about 10 at %, about 20 at % to about 60 at %, about 20 at % to about 50 at %, about 20 at % to about 45 at %, about 20 at % to about 40 at %, about 20 at % to about 38 at %, about 20 at % to about 36 at %, about 20 at % to about 35 at %, about 20 at % to about 32 at %, about 20 at % to about 30 at %, about 20 at % to about 25 at %, about 20 at % to about 22 at %, about 30 at % to about 60 at %, about 30 at % to about 50 at %, about 30 at % to about 45 at %, about 30 at % to about 40 at %, about 30 at % to about 38 at %, about 30 at % to about 36 at %, about 30 at % to about 35 at %, about 30 at % to about 32 at %, about 32 at % to about 38 at %, about 32 at % to about 36 at %, about 32 at % to about 34 at %, about 34 at % to about 38 at %, or about 34 at % to about 36 at %, based on the total amount of carbon atoms in the nitrogen-doped diamond-like carbon film.

A concentration or percentage of the nitrogen in the nitrogen-doped diamond-like carbon film is about 0.01 at %, about 0.05 at %, about 0.1 at %, about 0.3 at %, about 0.5 at %, about 0.8 at %, about 1 at %, about 1.2 at %, about 1.5 at %, about 1.8 at %, about 2 at %, about 2.5 at %, or about 2.8 at % to about 3 at %, about 3.5 at %, about 4 at %, about 5 at %, about 6 at %, about 7 at %, about 8 at %, about 9 at %, about 10 at %, about 12 at %, about 15 at %, about 18 at %, about 20 at %, about 25 at %, about 30 at %, or greater, based on the total amount of atoms in the nitrogen-doped diamond-like carbon film. For example, the concentration or percentage of the nitrogen in the nitrogen-doped diamond-like carbon film is about 0.01 at % to about 25 at %, about 0.1 at % to about 25 at %, about 0.5 at % to about 25 at %, about 1 at % to about 25 at %, about 2 at % to about 25 at %, about 3 at % to about 25 at %, about 5 at % to about 25 at %, about 7 at % to about 25 at %, about 10 at % to about 25 at %, about 12 at % to about 25 at %, about 15 at % to about 25 at %, about 18 at % to about 25 at %, about 20 at % to about 25 at %, about 0.1 at % to about 20 at %, about 0.5 at % to about 20 at %, about 1 at % to about 20 at %, about 2 at % to about 20 at %, about 3 at % to about 20 at %, about 5 at % to about 20 at %, about 7 at % to about 20 at %, about 10 at % to about 20 at %, about 12 at % to about 20 at %, about 15 at % to about 20 at %, about 18 at % to about 20 at %, about 0.1 at % to about 18 at %, about 0.5 at % to about 18 at %, about 1 at % to about 18 at %, about 2 at % to about 18 at %, about 3 at % to about 18 at %, about 5 at % to about 18 at %, about 7 at % to about 18 at %, about 10 at % to about 18 at %, about 12 at % to about 18 at %, about 15 at % to about 18 at %, about 0.1 at % to about 15 at %, about 0.5 at % to about 15 at %, about 1 at % to about 15 at %, about 2 at % to about 15 at %, about 3 at % to about 15 at %, about 5 at % to about 15 at %, about 7 at % to about 15 at %, about 10 at % to about 15 at %, about 12 at % to about 15 at %, about 0.01 at % to about 10 at %, about 0.1 at % to about 10 at %, about 0.5 at % to about 10 at %, about 1 at % to about 10 at %, about 2 at % to about 10 at %, about 3 at % to about 10 at %, about 4 at % to about 10 at %, about 5 at % to about 10 at %, about 7 at % to about 10 at %, about 0.01 at % to about 5 at %, about 0.1 at % to about 5 at %, about 0.5 at % to about 5 at %, about 1 at % to about 5 at %, about 2 at % to about 5 at %, or about 3 at % to about 5 at %, based on the total amount of atoms in the nitrogen-doped diamond-like carbon film.

The nitrogen-doped diamond-like carbon film has a density of greater than 1.5 g/cc (grams per cubic centimeter ($cm^3$)), such as about 1.55 g/cc, about 1.6 g/cc, about 1.65 g/cc, or about 1.68 g/cc to about 1.7 g/cc, about 1.72 g/cc, about 1.75 g/cc, about 1.78 g/cc, about 1.8 g/cc, about 1.85 g/cc, about 1.9 g/cc, about 1.95 g/cc, about 1.98 g/cc, about 2 g/cc, about 2.05 g/cc, about 2.1 g/cc, or greater. For example, the nitrogen-doped diamond-like carbon film has a density of greater than 1.5 g/cc to about 2.1 g/cc, greater than 1.5 g/cc to about 2.05 g/cc, greater than 1.5 g/cc to about 2 g/cc, greater than 1.5 g/cc to about 1.9 g/cc, greater than 1.5 g/cc to about 1.85 g/cc, greater than 1.5 g/cc to about 1.8 g/cc, greater than 1.5 g/cc to about 1.78 g/cc, greater than 1.5 g/cc to about 1.75 g/cc, greater than 1.5 g/cc to about 1.72 g/cc, greater than 1.5 g/cc to about 1.7 g/cc, greater than 1.5 g/cc to about 1.68 g/cc, greater than 1.5 g/cc to about 1.65 g/cc, greater than 1.5 g/cc to about 1.6 g/cc, about 1.6 g/cc to about 2.1 g/cc, about 1.6 g/cc to about 2.05 g/cc, about 1.6 g/cc to about 2 g/cc, about 1.6 g/cc to about 1.9 g/cc, about 1.6 g/cc to about 1.85 g/cc, about 1.6 g/cc to about 1.8 g/cc, about 1.6 g/cc to about 1.78 g/cc, about 1.6 g/cc to about 1.75 g/cc, about 1.6 g/cc to about 1.72 g/cc, about 1.6 g/cc to about 1.7 g/cc, about 1.6 g/cc to about 1.68 g/cc, about 1.6 g/cc to about 1.65 g/cc, about 1.68 g/cc to about 2.1 g/cc, about 1.68 g/cc to about 2.05 g/cc, about 1.68 g/cc to about 2 g/cc, about 1.68 g/cc to about 1.9 g/cc, about 1.68 g/cc to about 1.85 g/cc, about 1.68 g/cc to about 1.8 g/cc, about 1.68 g/cc to about 1.78 g/cc, about 1.68 g/cc to about 1.75 g/cc, about 1.68 g/cc to about 1.72 g/cc, about 1.68 g/cc to about 1.7 g/cc, about 1.7 g/cc to about 1.75 g/cc, about 1.7 g/cc to about 1.72 g/cc, about 1.55 g/cc to less than 2 g/cc, about 1.6 g/cc to less than 2 g/cc, about 1.65 g/cc to less than 2 g/cc, about 1.68 g/cc to less than 2 g/cc, about 1.7 g/cc to less than 2 g/cc, about 1.72 g/cc to less than 2 g/cc, about 1.75 g/cc to less than 2 g/cc, or about 1.8 g/cc to less than 2 g/cc.

The nitrogen-doped diamond-like carbon film can have a thickness of about 5 Å, about 10 Å, about 50 Å, about 100 Å, about 150 Å, about 200 Å, or about 300 Å to about 400 Å, about 500 Å, about 600 Å, about 700 Å, about 800 Å, about 1,000 Å, about 2,000 Å, about 3,000 Å, about 5,000 Å, about 6,000 Å, about 8,000 Å, about 10,000 Å, about 15,000 Å, about 20,000 Å, or thicker. For example, the nitrogen-doped diamond-like carbon film can have a thickness of about 5 Å to about 20,000 Å, about 5 Å to about 10,000 Å, about 5 Å to about 5,000 Å, about 5 Å to about 3,000 Å, about 5 Å to about 2,000 Å, about 5 Å to about 1,000 Å, about 5 Å to about 500 Å, about 5 Å to about 200 Å, about 5 Å to about 100 Å, about 5 Å to about 50 Å, about 200 Å to about 20,000 Å, about 200 Å to about 10,000 Å, about 200 Å to about 6,000 Å, about 200 Å to about 5,000 Å, about 200 Å to about 3,000 Å, about 200 Å to about 2,000 Å, about 200 Å to about 1,000 Å, about 200 Å to about 500 Å, about 600 Å to about 3,000 Å, about 600 Å to about 2,000 Å, about 600 Å to about 1,500 Å, about 600 Å to about 1,000 Å, about 600 Å to about 800 Å, about 1,000 Å to about 20,000 Å, about 1,000 Å to about 10,000 Å, about 1,000 Å to about 5,000 Å, about 1,000 Å to about 3,000 Å, about 1,000 Å to about 2,000 Å, about 2,000 Å to about 20,000 Å, or about 2,000 Å to about 3,000 Å.

The nitrogen-doped diamond-like carbon film can have a refractive index or n-value (n (at 633 nm)) of greater than 2, such as about 2.1, about 2.2, about 2.3, about 2.4 or about 2.5 to about 2.6, about 2.7, about 2.8, about 2.9, or about 3. For example, the nitrogen-doped diamond-like carbon film can have a refractive index or n-value (n (at 633 nm)) of greater than 2 to about 3, greater than 2 to about 2.8, greater than 2 to about 2.5, greater than 2 to about 2.3, about 2.1 to about 3, about 2.1 to about 2.8, about 2.1 to about 2.5, about 2.1 to about 2.3, about 2.3 to about 3, about 2.3 to about 2.8, or about 2.3 to about 2.5.

The nitrogen-doped diamond-like carbon film can have an extinction coefficient or k-value (K (at 633 nm)) of greater than 0.1, such as about 0.15, about 0.2, about 0.25, or about 0.3. For example, the nitrogen-doped diamond-like carbon film can have an extinction coefficient or k-value (K (at 633 nm)) of greater than 0.1 to about 0.3, greater than 0.1 to about 0.25, greater than 0.1 to about 0.2, greater than 0.1 to about 0.15, about 0.2 to about 0.3, or about 0.2 to about 0.25.

The nitrogen-doped diamond-like carbon film can have a compressive stress of less than −600 MPa, such as about −10 MPa, about −20 MPa, about −50 MPa, about −80 MPa, about −100 MPa, about −150 MPa, about −200 MPa, about −250 MPa, about −275 MPa, or about −300 MPa to about −325 MPa, about −350 MPa, about −375 MPa, about −400 MPa, about −425 MPa, about −450 MPa, about −475 MPa, about −500 MPa, about −550 MPa, about −580 MPa, or about −590 MPa. For example, the nitrogen-doped diamond-like carbon film can have a compressive stress of about −20 MPa to less than −600 MPa, about −50 MPa to less than −600 MPa, about −100 MPa to less than −600 MPa, about −200 MPa to less than −600 MPa, about −250 MPa to less than −600 MPa, about −300 MPa to less than −600 MPa, about −350 MPa to less than −600 MPa, about −400 MPa to less than −600 MPa, about −450 MPa to less than −600 MPa, about −500 MPa to less than −600 MPa, about −20 MPa to about −500 MPa, about −100 MPa to about −500 MPa, about −200 MPa to about −500 MPa, about −250 MPa to about −500 MPa, about −300 MPa to about −500 MPa, about −350 MPa to about −500 MPa, about −400 MPa to about −500 MPa, about −450 MPa to about −500 MPa, about −20 MPa to about −400 MPa, about −100 MPa to about −400 MPa, about −200 MPa to about −400 MPa, about −250 MPa to about −400 MPa, about −300 MPa to about −400 MPa, or about −350 MPa to about −400 MPa.

The nitrogen-doped diamond-like carbon film can have an elastic modulus of greater than 50 GPa or greater than 60 GPa, such as about 65 GPa, about 70 GPa, about 75 GPa, about 90 GPa, about 100 GPa, about 125 GPa, or about 150 GPa to about 175 GPa, about 200 GPa, about 250 GPa, about 275 GPa, about 300 GPa, about 350 GPa, or about 400 GPa. For example, the nitrogen-doped diamond-like carbon film can have an elastic modulus of greater than 60 GPa to about 400 GPa, greater than 60 GPa to about 350 GPa, greater than 60 GPa to about 300 GPa, greater than 60 GPa to about 250 GPa, greater than 60 GPa to about 200 GPa, greater than 60 GPa to about 150 GPa, greater than 60 GPa to about 125 GPa, greater than 60 GPa to about 100 GPa, greater than 60 GPa to about 80 GPa, about 65 GPa to about 400 GPa, about 65 GPa to about 350 GPa, about 65 GPa to about 300 GPa, about 65 GPa to about 250 GPa, about 65 GPa to about 200 GPa, about 65 GPa to about 150 GPa, about 65 GPa to about 125 GPa, about 65 GPa to about 100 GPa, about 65 GPa to about 80 GPa, about 80 GPa to about 400 GPa, about 80 GPa to about 350 GPa, about 80 GPa to about 300 GPa, about 80 GPa to about 250 GPa, about 80 GPa to about 200 GPa, about 80 GPa to about 150 GPa, about 80 GPa to about 125 GPa, or about 80 GPa to about 100 GPa. In one or more examples, the nitrogen-doped diamond-like carbon film can have the aforementioned elastic modulus and have a thickness of about 600 Å.

In some embodiments, the nitrogen-doped diamond-like carbon film is an underlayer for an extreme ultraviolet ("EUV") lithography process. In some examples, the nitrogen-doped diamond-like carbon film is an underlayer for an EUV lithography process and has an $sp^a$ hybridized carbon atom content of about 40% to about 90% based on the total amount of carbon atoms in the film, a density of greater than 1.5 g/cc to about 1.9 g/cc, and an elastic modulus that is greater than or about 60 GPa to about 150 GPa or about 200 GPa.

FIG. 1A depicts a schematic illustration of a substrate processing system 132 that can be used to perform nitrogen-doped diamond-like carbon film deposition in accordance with embodiments described herein. The substrate processing system 132 includes a process chamber 100 coupled to a gas panel 130 and a controller 110. The process chamber 100 generally includes a top wall 124, a sidewall 101 and a bottom wall 122 that define a processing volume 126. A substrate support assembly 146 is provided in the processing volume 126 of the process chamber 100. The substrate support assembly 146 generally includes an electrostatic chuck 150 supported by a stem 160. The electrostatic chuck 150 may be typically fabricated from aluminum, ceramic, and other suitable materials. The electrostatic chuck 150 may be moved in a vertical direction inside the process chamber 100 using a displacement mechanism (not shown).

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

The substrate processing system 132 may further include additional equipment for controlling the chamber pressure, for example, valves (e.g., throttle valves and isolation valves) positioned between the process chamber 100 and the vacuum pump 102 to control the chamber pressure.

A gas distribution assembly 120 having a plurality of apertures 128 is disposed on the top of the process chamber 100 above the electrostatic chuck 150. The apertures 128 of the gas distribution assembly 120 are utilized to introduce process gases (e.g., deposition gas, dilution gas, carrier gas, purge gas) into the process chamber 100. The apertures 128 may have different sizes, number, distributions, shape, design, and diameters to facilitate the flow of the various processing gases for different process requirements. The gas distribution assembly 120 is connected to the gas panel 130 that allows various gases to supply to the processing volume 126 during processing. A plasma is formed from the processing gas mixture exiting the gas distribution assembly 120 to enhance thermal decomposition of the processing gases resulting in the deposition of material on a surface 191 of the substrate 190.

The gas distribution assembly 120 and the electrostatic chuck 150 may form a pair of spaced apart electrodes in the processing volume 126. One or more RF power source 140 provide a bias potential through a matching network 138, which is optional, to the gas distribution assembly 120 to facilitate generation of plasma between the gas distribution assembly 120 and the electrostatic chuck 150. Alternatively, the RF power source 140 and the matching network 138 may be coupled to the gas distribution assembly 120, the electrostatic chuck 150, or coupled to both the gas distribution assembly 120 and the electrostatic chuck 150, or coupled to an antenna (not shown) disposed exterior to the process chamber 100. In one or more examples, the RF power source 140 may produce power at a frequency of about 350 KHz, about 2 MHz, about 13.56 MHz, about 27 MHz, about 40 MHz, about 60 MHz, or about 100 MHz. In some examples, the RF power source 140 may provide power of about 100 watts to about 3,000 watts at a frequency of about 50 kHz to about 13.6 MHz. In other examples, the RF power source 140 may provide power of about 500 watts to about 1,800 watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1A.

Figure 1B:
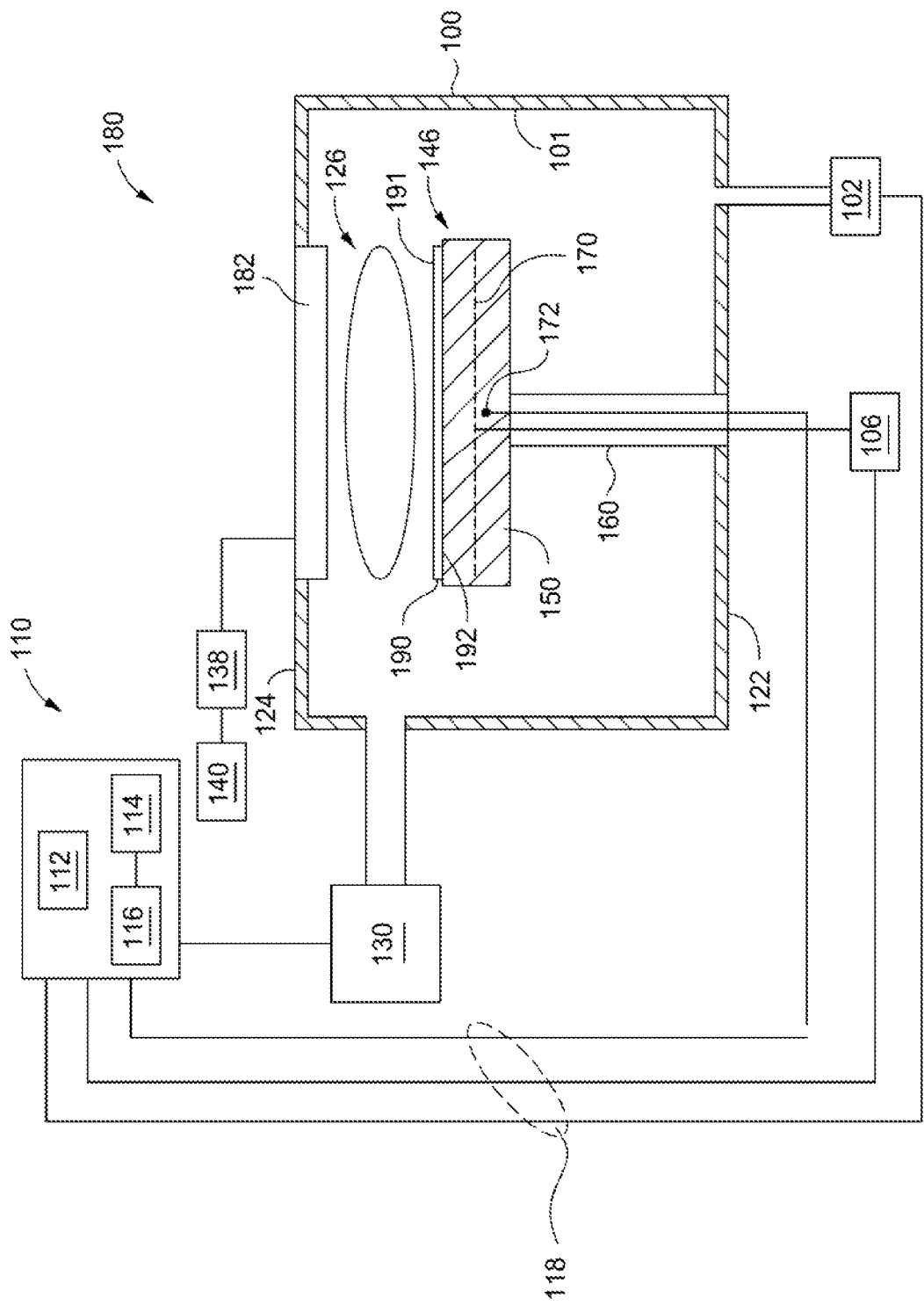
FIG. 1B depicts a schematic cross-sectional view of another deposition system that can be used to practice processes according to one or more embodiments described and discussed herein.

FIG. 1B depicts a schematic cross-sectional view of another substrate processing system 180 that can be used for the practice of embodiments described herein. The substrate processing system 180 is similar to the substrate processing system 132 of FIG. 1A, except that the substrate processing system 180 is configured to flow processing gases from gas panel 130 across the surface 191 of the substrate 190 via the sidewall 101. In addition, the gas distribution assembly 120 depicted in FIG. 1A is replaced with an electrode 182. The electrode 182 may be configured for secondary electron generation. In one or more embodiments, the electrode 182 is a silicon-containing electrode.

Figure 2:
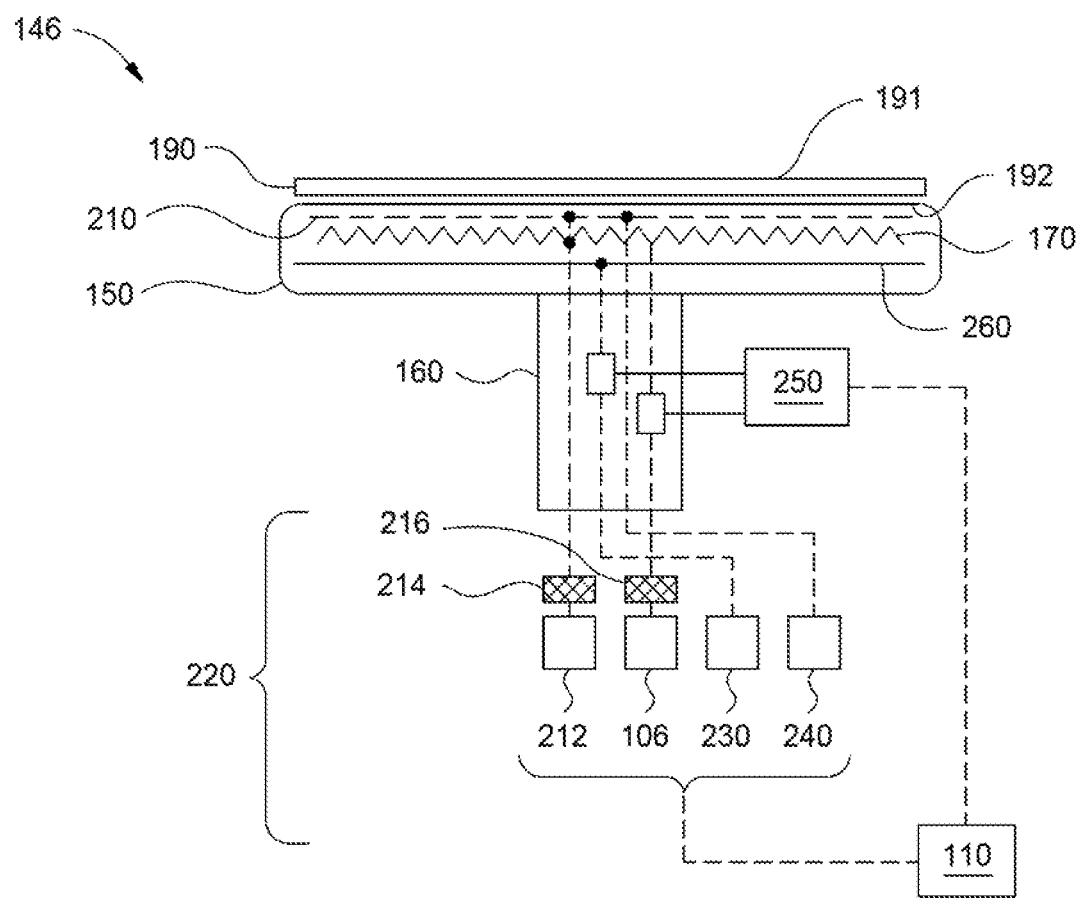
FIG. 2 depicts a schematic cross-sectional view of an electrostatic chuck that may be used in the apparatus of FIGS. 1A-1B, according to one or more embodiments described and discussed herein.

FIG. 2 depicts a schematic cross-sectional view of the substrate support assembly 146 used in the processing systems of FIG. 1A and FIG. 1B that can be used for the practice of embodiments described herein. Referring to FIG. 2, the electrostatic chuck 150 may include a heater element 170 suitable for controlling the temperature of a substrate 190 supported on an upper surface 192 of the electrostatic chuck 150. The heater element 170 may be embedded in the electrostatic chuck 150. The electrostatic chuck 150 may be resistively heated by applying an electric current from a heater power source 106 to the heater element 170. The heater power source 106 may be coupled through an RF filter 216. The RF filter 216 may be used to protect the heater power source 106 from RF energy. The heater element 170 may be made of a nickel-chromium wire encapsulated in a nickel-iron-chromium alloy (e.g., INCOLOY® alloy) sheath tube. The electric current supplied from the heater power source 106 is regulated by the controller 110 to control the heat generated by the heater element 170, thus maintaining the substrate 190 and the electrostatic chuck 150 at a substantially constant temperature during film deposition. The supplied electric current may be adjusted to selectively control the temperature of the electrostatic chuck 150 to be about −50° C. to about 600° C.

Referring to FIG. 1, a temperature sensor 172, such as a thermocouple, may be embedded in the electrostatic chuck 150 to monitor the temperature of the electrostatic chuck 150 in a conventional manner. The measured temperature is used by the controller 110 to control the power supplied to the heater element 170 to maintain the substrate at a desired temperature.

The electrostatic chuck 150 includes a chucking electrode 210, which may be a mesh of a conductive material. The chucking electrode 210 may be embedded in the electrostatic chuck 150. The chucking electrode 210 is coupled to a chucking power source 212 that, when energized, electrostatically clamps the substrate 190 to the upper surface 192 of the electrostatic chuck 150.

The chucking electrode 210 may be configured as a monopolar or bipolar electrode, or have another suitable arrangement. The chucking electrode 210 may be coupled through an RF filter 214 to the chucking power source 212, which provides direct current (DC) power to electrostatically secure the substrate 190 to the upper surface 192 of the electrostatic chuck 150. The RF filter 214 prevents RF power utilized to form plasma within the process chamber 100 from damaging electrical equipment or presenting an electrical hazard outside the chamber. The electrostatic chuck 150 may be fabricated from a ceramic material, such as aluminum nitride or aluminum oxide (e.g., alumina). Alternately, the electrostatic chuck 150 may be fabricated from a polymer, such as polyimide, polyetheretherketone (PEEK), polyaryletherketone (PAEK), and the like.

A power application system 220 is coupled to the substrate support assembly 146. The power application system 220 may include the heater power source 106, the chucking power source 212, a first radio frequency (RF) power source 230, and a second RF power source 240. The power application system 220 may additionally include the controller 110, and a sensor device 250 that is in communication with the controller 110 and both of the first RF power source 230 and the second RF power source 240. The controller 110 may also be utilized to control the plasma from the processing gas by application of RF power from the first RF power source 230 and the second RF power source 240 in order to deposit a layer of material on the substrate 190.

As described above, the electrostatic chuck 150 includes the chucking electrode 210 that may function in one aspect to chuck the substrate 190 while also functioning as a first RF electrode. The electrostatic chuck 150 may also include a second RF electrode 260, and together with the chucking electrode 210, may apply RF power to tune the plasma. The first RF power source 230 may be coupled to the second RF electrode 260 while the second RF power source 240 may be coupled to the chucking electrode 210. A first matching network and a second matching network may be provided for the first RF power source 230 and the second RF power source 240, respectively. The second RF electrode 260 may be a solid metal plate of a conductive material as shown. Alternatively, the second RF electrode 260 may be a mesh of conductive material.

The first RF power source 230 and the second RF power source 240 may produce power at the same frequency or a different frequency. In one or more embodiments, one or both of the first RF power source 230 and the second RF power source 240 may independently produce power at a frequency from about 350 KHz to about 100 MHz (e.g., 350 KHz, 2 MHz, 13.56 MHz, 27 MHz, 40 MHz, 60 MHz, or 100 MHz). In one or more embodiments, the first RF power source 230 may produce power at a frequency of 13.56 MHz and the second RF power source 240 may produce power at a frequency of 2 MHz, or vice versa. RF power from one or both of the first RF power source 230 and second RF power source 240 may be varied in order to tune the plasma. For example, the sensor device 250 may be used to monitor the RF energy from one or both of the first RF power source 230 and the second RF power source 240. Data from the sensor device 250 may be communicated to the controller 110, and the controller 110 may be utilized to vary power applied by the first RF power source 230 and the second RF power source 240.

In one or more embodiments, the electrostatic chuck 150 has the chucking electrode 210 and an RF electrode separate from each other, and the first RF bias can be applied to the RF electrode 260 and the second RF bias can be applied to the chucking electrode 210. In one or more examples, the first RF bias is provided at a power of about 10 watts to about 3,000 watts at a frequency of about 350 KHz to about 100 MHz and the second RF bias is provided at a power of about 10 watts to about 3,000 watts at a frequency of about 350 KHz to about 100 MHz. In other examples, the first RF bias is provided at a power of about 2,500 watts to about 3,000 watts at a frequency of about 13.56 MHz and the second RF bias is provided at a power of about 800 watts to about 1,200 watts at a frequency of about 2 MHz.

In one or more embodiments, a deposition gas containing one or more hydrocarbon compounds and one or more nitrogen dopant compounds may be flowed or otherwise introduced into the processing volume of the process chamber, such as a PE-CVD chamber. The hydrocarbon compound and the nitrogen dopant compound may be independently flowed or introduced into the processing volume. In some examples, one or more substrates are positioned on an electrostatic chuck in the process chamber. The electrostatic chuck can have a chucking electrode and an RF electrode separate from each other. A plasma may be ignited or otherwise generated at or near the substrate (e.g., substrate level) by applying a first RF bias to the RF electrode and a second RF bias to the chucking electrode. The nitrogen-doped diamond-like carbon film is deposited or otherwise formed on the substrate. In some embodiments, a patterned photoresist layer may be deposited or otherwise formed over the nitrogen-doped diamond-like carbon film, the nitrogen-doped diamond-like carbon film is etched or otherwise formed in a pattern corresponding with the patterned photoresist layer, and the pattern is etched or otherwise formed into the substrate.

In general, the following exemplary deposition process parameters may be used to form the nitrogen-doped diamond-like carbon film. The substrate temperature may range of about −50° C. to about 350° C. (e.g., about −40° C. to about 100° C., about 10° C. to about 100° C., or about 10° C. to about 50° C.). The chamber pressure may range from a chamber pressure of about 0.5 mTorr to about 10 Torr (e.g., about 2 mTorr to about 50 mTorr, or about 2 mTorr to about 10 mTorr). The flow rate of the hydrocarbon compound may be about 20 sccm to about 5,000 sccm (e.g., about 50 sccm to about 1,000 sccm, about 100 sccm to about 200 sccm, or about 150 sccm to about 200 sccm). The flow rate of the nitrogen dopant compound (e.g., $N_2$) may be about 1 sccm to about 3,000 sccm (e.g., about 5 sccm to about 500 sccm, about 10 sccm to about 150 sccm, or about 20 sccm to about 100 sccm). The flow rate of a dilution gas or purge gas (e.g., He) may be about 1 sccm to about 3,000 sccm (e.g., about 5 sccm to about 500 sccm, about 10 sccm to about 150 sccm, or about 20 sccm to about 100 sccm). The nitrogen-doped diamond-like carbon film may be deposited to a thickness of about 200 Å and about 6,000 Å (e.g., about 300 Å to about 5,000 Å; about 400 Å to about 800 Å; about 2,000 Å and about 3,000 Å, or about 5 Å to about 200 Å—depending on application). In one or more examples, these process parameters provide examples of process parameters for a 300 mm substrate in a deposition chamber commercially available from Applied Materials, Inc. of Santa Clara, Calif.

Figure 3:
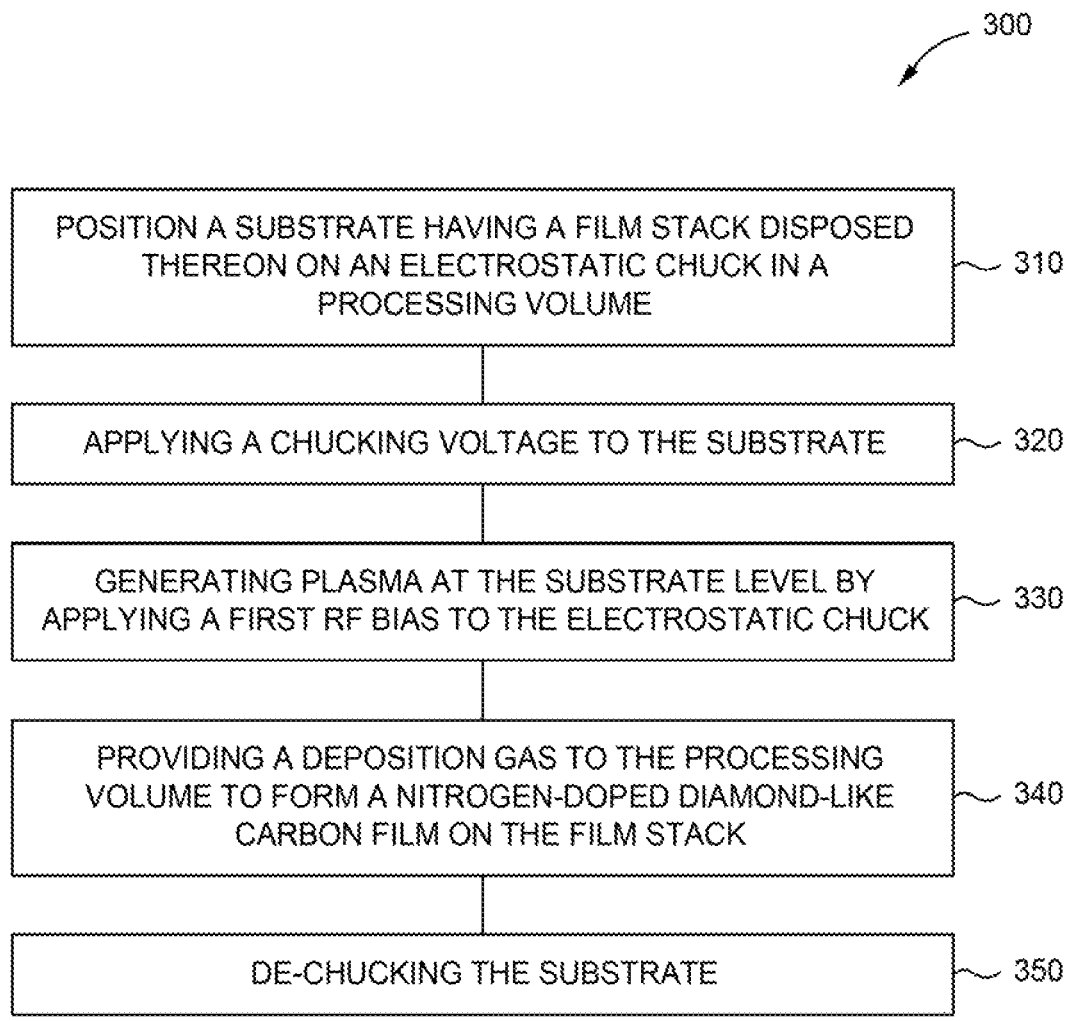
FIG. 3 depicts a flow diagram of a method for forming a nitrogen-doped diamond-like carbon film on a film stack disposed on a substrate according to one or more embodiments described and discussed herein.
Figure 4A:
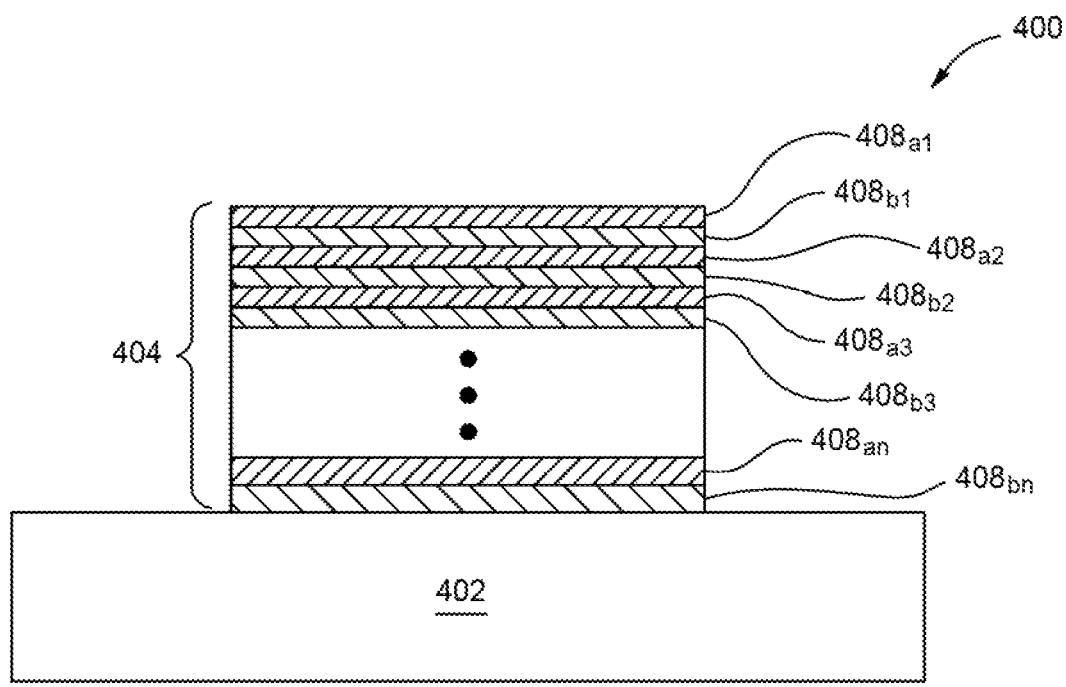
FIGS. 4A-4B depict a sequence for forming a nitrogen-doped diamond-like carbon film on a film stack formed on a substrate according to one or more embodiments described and discussed herein.
Figure 4B:
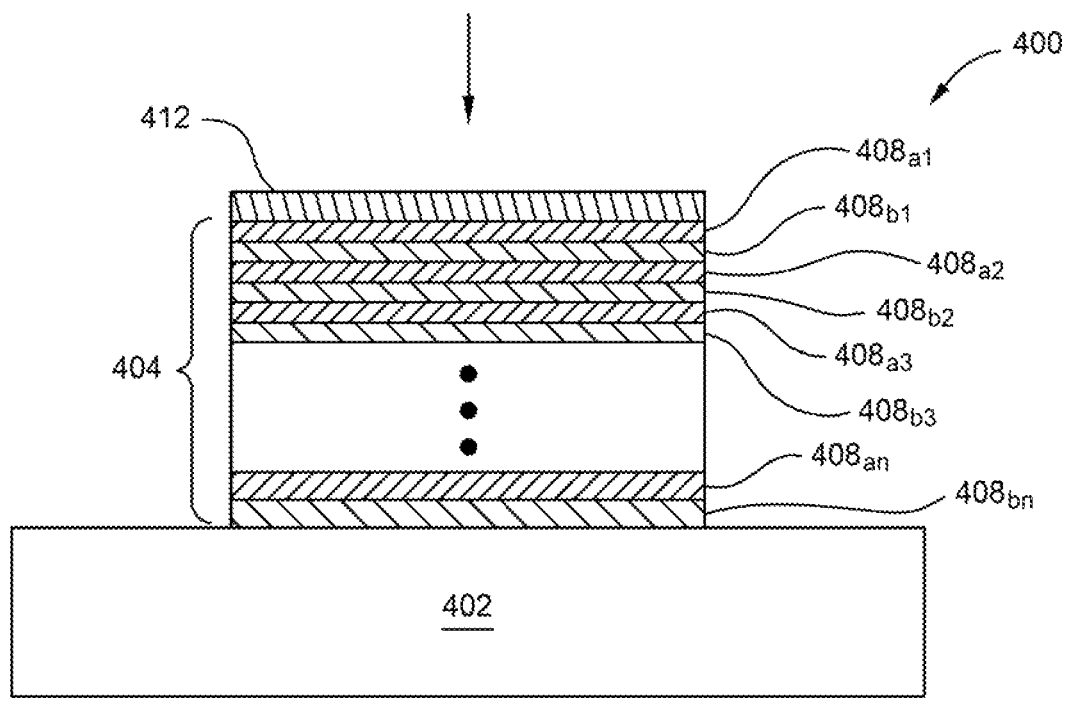

FIG. 3 depicts a flow diagram of a method 300 for forming a nitrogen-doped diamond-like carbon film on a film stack disposed on a substrate in accordance with one embodiment of the present disclosure. The nitrogen-doped diamond-like carbon film formed on a film stack may be utilized, for example, as a hardmask to form stair-like structures in the film stack. FIGS. 4A-4B are schematic cross-sectional views illustrating a sequence for forming a nitrogen-doped diamond-like carbon film on a film stack disposed on a substrate according to the method 300. Although the method 300 is described below with reference to a hardmask layer that may be formed on a film stack utilized to manufacture stair-like structures in the film stack for three dimensional semiconductor devices, the method 300 may also be used to advantage in other device manufacturing applications. Further, it should also be understood that the operations depicted in FIG. 3 may be performed simultaneously and/or in a different order than the order depicted in FIG. 3.

The method 300 begins at operation 310 by positioning a substrate, such as a substrate 402 depicted in FIG. 4A, into a processing volume of a process chamber, such as the process chamber 100 depicted in FIG. 1A or FIG. 1B. The substrate 402 may be substrate 190 depicted in FIG. 1A, FIG. 1B, and FIG. 2. The substrate 402 may be positioned on an electrostatic chuck, for example, the upper surface 192 of the electrostatic chuck 150. The substrate 402 may be a silicon-based material or any suitable insulating material or conductive material as needed, having a film stack 404 disposed on the substrate 402 that may be utilized to form a structure 400, such as stair-like structures, in the film stack 404.

As shown in the embodiment depicted in FIG. 4A, the substrate 402 may have a substantially planar surface, an uneven surface, or a substantially planar surface having a structure formed thereon. The film stack 404 is formed on the substrate 402. In one or more embodiments, the film stack 404 may be utilized to form a gate structure, a contact structure or an interconnection structure in a front end or back end process. The method 300 may be performed on the film stack 404 to form the stair-like structures therein used in a memory structure, such as NAND structure. In one or more embodiments, the substrate 402 may be a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 402 may have various dimensions, such as 200 mm, 300 mm, 450 mm, or other diameter substrates, as well as, rectangular or square panels. Unless otherwise noted, embodiments and examples described herein are conducted on substrates with a 200 mm diameter, a 300 mm diameter, or a 450 mm diameter substrate. In the embodiment wherein a SOI structure is utilized for the substrate 402, the substrate 402 may include a buried dielectric layer disposed on a silicon crystalline substrate. In one or more embodiments depicted herein, the substrate 402 may be a crystalline silicon substrate.

In one or more embodiments, the film stack 404 disposed on the substrate 402 may have a number of vertically stacked layers. The film stack 404 may contain pairs including a first layer (shown as $408a_1$, $408a_2$, $408a_3$, . . . , $408a_n$) and a second layer (shown as $408b_1$, $408b_2$, $408b_3$, . . . , $408b_n$) repeatedly formed in the film stack 404. The pairs includes alternating first layer (shown as $408a_1$, $408a_2$, $408a_3$, . . . , 408$a_n$) and second layer (shown as 408$b_1$, 408$b_2$, 408$b_3$, ..., 408$b_n$) repeatedly formed until desired numbers of pairs of the first layers and the second layers are reached.

The film stack 404 may be a part of a semiconductor chip, such as a three-dimensional memory chip Although three repeating layers of first layers (shown as 408$a_1$, 408$a_2$, 408$a_3$, ..., 408$a_n$) and second layers (shown as 408$b_1$, 408$b_2$, 408$b_3$, ..., 408$b_n$) are shown in FIGS. 4A-4B, it is noted that any desired number of repeating pairs of the first and the second layers may be utilized as needed.

In one or more embodiments, the film stack 404 may be utilized to form multiple gate structures for a three-dimensional memory chip. The first layers 408$a_1$, 408$a_2$, 408$a_3$, ..., 408$a_n$, formed in the film stack 404 may be a first dielectric layer and the second layers 408$b_1$, 408$b_2$, 408$b_3$, ..., 408$b_n$ may be a second dielectric layer. Suitable dielectric layers may be utilized to form the first layers 408$a_1$, 408$a_2$, 408$a_3$, 408$a_n$ and the second layer 408$b_1$, 408$b_2$, 408$b_3$, ..., 408$b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In one or more embodiments, the dielectric layers may be a high-k material having a dielectric constant greater than 4. Suitable examples of the high-k materials include hafnium oxide, zirconium oxide, titanium oxide, hafnium silicon oxide or hafnium silicate, hafnium aluminum oxide or hafnium aluminate, zirconium silicon oxide or zirconium silicate, tantalum oxide, aluminum oxide, aluminum doped hafnium dioxide, bismuth strontium titanium (BST), and platinum zirconium titanium (PZT), dopants thereof, or any combination thereof.

In one or more examples, the first layers 408$a_1$, 408$a_2$, 408$a_3$, 408$a_n$ are silicon oxide layers and the second layers 408$b_1$, 408$b_2$, 408$b_3$, 408$b_n$ are silicon nitride layers or polysilicon layers disposed on the first layers 408$a_1$, 408$a_2$, 408$a_3$, 408$a_n$. In one or more embodiments, the thickness of first layers 408$a_1$, 408$a_2$, 408$a_3$, 408$a_n$ may be controlled to be about 50 Å to about 1,000 Å, such as about 500 Å, and the thickness of the each second layers 408$b_1$, 408$b_2$, 408$b_3$, 408$b_n$ may be controlled to be about 50 Å to about 1,000 Å, such as about 500 Å. The film stack 404 may have a total thickness of about 100 Å to about 2,000 Å. In one or more embodiments, a total thickness of the film stack 404 is about 3 microns to about 10 microns and can vary as technology advances.

It is noted that the nitrogen-doped diamond-like carbon film may be formed on any surfaces or any portion of the substrate 402 with or without the film stack 404 present on the substrate 402.

At operation 320, a chucking voltage is applied to the electrostatic chuck and the substrate 402 clamped or otherwise disposed on to the electrostatic chuck. In one or more embodiments, where the substrate 402 is positioned on the upper surface 192 of the electrostatic chuck 150, the upper surface 192 provides support and clamps the substrate 402 during processing. The electrostatic chuck 150 flattens the substrate 402 closely against the upper surface 192, preventing backside deposition. An electrical bias is provided to the substrate 402 via chucking electrode 210. The chucking electrode 210 may be in electronic communication with the chucking power source 212 that supplies a biasing voltage to the chucking electrode 210. In one or more embodiments, the chucking voltage is about 10 volts to about 3,000 volts, about 100 volts to about 2,000 volts, or about 200 volts to about 1,000 volts.

During operation 320, several process parameters may be regulated the process. In one embodiment suitable for processing a 300 mm substrate, the process pressure in the processing volume may be maintained at about 0.1 mTorr to about 10 Torr (e.g., about 2 mTorr to about 50 mTorr; or about 5 mTorr to about 20 mTorr). In some embodiments suitable for processing a 300 mm substrate, the processing temperature and/or substrate temperature may be maintained at about −50° C. to about 350° C. (e.g., about 0° C. to about 50° C.; or about 10° C. to about 20° C.).

In one or more embodiments, a constant chucking voltage is applied to the substrate 402. In some embodiments, the chucking voltage may be pulsed to the electrostatic chuck 150. In other embodiments, a backside gas may be applied to the substrate 402 while applying the chucking voltage to control the temperature of the substrate. Backside gases can be or include helium, argon, neon, nitrogen ($N_2$), hydrogen ($H_2$), or any combination thereof.

At operation 330, a plasma is generated at the substrate, such as adjacent the substrate or near the substrate level, by applying a first RF bias to the electrostatic chuck. Plasma generated at the substrate may be generated in a plasma region between the substrate and the electrostatic chuck. The first RF bias may be from about 10 watts to about 3,000 watts at a frequency of about 350 KHz to about 100 MHz (e.g., about 350 KHz, about 2 MHz, about 13.56 MHz, about 27 MHz, about 40 MHz, about 60 MHz, or about 100 MHz). In one or more embodiments, the first RF bias is provided at a power of about 2,500 watts to about 3,000 watts at a frequency of about 13.56 MHz. In one or more embodiments, the first RF bias is provided to the electrostatic chuck 150 via the second RF electrode 260. The second RF electrode 260 may be in electronic communication with the first RF power source 230 that supplies a biasing voltage to the second RF electrode 260. In one or more embodiments, the bias power is about 10 watts to about 3,000 watts, about 2,000 watts to about 3,000 watts, or about 2,500 watts to about 3,000 watts. The first RF power source 230 may produce power at a frequency of about 350 KHz to about 100 MHz (e.g., about 350 KHz, about 2 MHz, about 13.56 MHz, about 27 MHz, about 40 MHz, about 60 MHz, or about 100 MHz).

In one or more embodiments, operation 330 further includes applying a second RF bias to the electrostatic chuck. The second RF bias may be from about 10 watts to about 3,000 watts at a frequency of about 350 KHz to about 100 MHz (e.g., about 350 KHz, about 2 MHz, about 13.56 MHz, about 27 MHz, about 40 MHz, about 60 MHz, or about 100 MHz). In some examples, the second RF bias is provided at a power of about 800 watts to about 1,200 watts at a frequency of about 2 MHz. In other examples, the second RF bias is provided to the substrate 402 via the chucking electrode 210. The chucking electrode 210 may be in electronic communication with second RF power source 240 that supplies a biasing voltage to the chucking electrode 210. In one or more examples, the bias power is about 10 watts to about 3,000 watts, about 500 watts to about 1,500 watts, or about 800 watts to about 1,200 watts. The second RF power source 240 may produce power at a frequency of about 350 KHz to about 100 MHz (e.g., about 350 KHz, about 2 MHz, about 13.56 MHz, about 27 MHz, about 40 MHz, about 60 MHz, or about 100 MHz). In one or more embodiments, the chucking voltage supplied in operation 320 is maintained during operation 330.

In some embodiments, during operation 330, the first RF bias is provided to the substrate 402 via the chucking electrode 210 and the second RF bias may be provided to the substrate 402 via the second RF electrode 260. In one or more examples, the first RF bias is about 2,500 watts (about 13.56 MHz) and the second RF bias is about 1,000 watts (about 2 MHz).

During operation 340, a deposition gas is flowed into the processing volume 126 to form the nitrogen-doped diamond-like carbon film on the film stack. The deposition gas may be flowed from the gas panel 130 into the processing volume 126 either through the gas distribution assembly 120 or via the sidewall 101. The deposition gas contains one or more hydrocarbon compounds and one or more nitrogen dopant compounds. The hydrocarbon compound can be or include one, two, or more one hydrocarbon compounds in any state of matter. Similarly, the nitrogen dopant compound can be or include one, two, or more one nitrogen dopant compounds in any state of matter. The hydrocarbon and/or nitrogen dopant compounds can be any liquid or gas, but some advantages may be realized if any of the precursors is vapor at room temperature in order to simplify the hardware needed for material metering, control, and delivery to the processing volume.

The deposition gas may further include an inert gas, a dilution gas, a nitrogen-containing gas, an etchant gas or any combination thereof. In one or more embodiments, the chucking voltage supplied during operation 320 is maintained during operation 340. In some embodiments, the process conditions established during operation 320 and plasma formed during operation 330 are maintained during operation 340.

In one or more embodiments, the hydrocarbon compound is a gaseous hydrocarbon or a liquid hydrocarbon. The hydrocarbon can be or include one or more alkanes, one or more alkenes, one or more alkynes, one or more aromatic, or any combination thereof. In some examples, the hydrocarbon compound has a general formula $C_xH_y$, where x has a range of 1 to about 20 and y has a range of 1 to about 20. Suitable hydrocarbon compounds include, for example, $C_2H_2$, $C_3H_6$, $CH_4$, $C_4H_8$, 1,3-dimethyladamantane, bicyclo[2.2.1]hepta-2,5-diene (2,5-norbornadiene), adamantine ($C_{10}H_{16}$), norbornene ($C_7H_{10}$), or any combination thereof. In one or more examples, ethyne is utilized due to formation of more stable intermediate species, which allows more surface mobility.

The hydrocarbon compound can be or include one or more alkanes (e.g., $C_nH_{2n+2}$, wherein n is from 1 to 20). Suitable hydrocarbon compounds include, for example, alkanes such as methane ($CH_4$), ethane ($C_2H_6$), propane ($C_3H_8$), butane ($C_4H_{10}$) and its isomer isobutane, pentane ($C_5H_{12}$), hexane ($C_6H_{14}$) and its isomers isopentane and neopentane, hexane ($C_6H_{14}$) and its isomers 2-methylpentane, 3-methylpentane, 2,3-dimethylbutane, and 2,2-dimethyl butane, or any combination thereof.

The hydrocarbon compound can be or include one or more alkenes (e.g., $C_nH_{2n}$, wherein n is from 1 to 20). Suitable hydrocarbon compounds include, for example, alkenes such as ethylene, propylene ($C_3H_6$), butylene and its isomers, pentene and its isomers, and the like, dienes such as butadiene, isoprene, pentadiene, hexadiene, or any combination thereof. Additional suitable hydrocarbons include, for example, halogenated alkenes such as monofluoroethylene, difluoroethylenes, trifluoroethylene, tetrafluoroethylene, monochloroethylene, dichloroethylenes, trichloroethylene, tetrachloroethylene, or any combination thereof.

The hydrocarbon compound can be or include one or more alkynes (e.g., $C_nH_{2n-2}$, wherein n is from 1 to 20). Suitable hydrocarbon compounds include, for example, alkynes such as ethyne or acetylene ($C_2H_2$), propyne ($C_3H_4$), butylene ($C_4H_8$), vinylacetylene, or any combination thereof.

The hydrocarbon compound can be or include one or more aromatic hydrocarbon compounds, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurylether, compounds having the formula $C_3H_2$ and $C_5H_4$, halogenated aromatic compounds including monofluorobenzene, difluorobenzenes, tetrafluorobenzenes, hexafluorobenzene, or any combination thereof.

The deposition gas contains one or more nitrogen dopant compounds. Exemplary nitrogen dopant compounds can be or include dinitrogen ($N_2$), atomic nitrogen, ammonia, hydrazine, methylhydrazine, dimethlyhydrazine, t-butylhydrazine, phenylhydrazine, azoisobutane, ethylazide, pyridine, derivatives thereof, abducts thereof, or any combination thereof. In one or more embodiments, the deposition gas further contains one or more dilution gases, one or more carrier gases, and/or one or more purge gases. Suitable dilution gases, carrier gases, and/or purge gases such as helium (He), argon (Ar), xenon (Xe), hydrogen ($H_2$), nitrogen ($N_2$), ammonia ($NH_3$), nitric oxide (NO), or any combination thereof, among others, may be co-flowed or otherwise supplied with the deposition gas into the processing volume 126. Argon, helium, and/or nitrogen can be used to control the density and deposition rate of the nitrogen-doped diamond-like carbon film. In some cases, the addition of $N_2$ and/or $NH_3$ can be used to control the hydrogen ratio of the nitrogen-doped diamond-like carbon film, as discussed below. Alternatively, dilution gases may not be used during the deposition.

In some embodiments, the deposition gas further contains an etchant gas. Suitable etchant gases can be or include chlorine ($Cl_2$), fluorine ($F_2$), hydrogen fluoride (HF), carbon tetrafluoride ($CF_4$), nitrogen trifluoride ($NF_3$), or any combination thereof. Not to be bound by theory, but it is believed that the etchant gases selectively etch $sp^2$ hybridized carbon atoms from the film thus increasing the fraction of $sp^3$ hybridized carbon atoms in the film, which increases the etch selectivity of the film.

In one or more embodiments, after the nitrogen-doped diamond-like carbon film 412 is formed on the substrate during operation 340, the nitrogen-doped diamond-like carbon film 412 is exposed to hydrogen radicals. In some embodiments, the nitrogen-doped diamond-like carbon film is exposed to hydrogen radicals during the deposition process of operation 340. In other embodiments, the hydrogen radicals formed in an RPS and delivered to the processing region. Not to be bound by theory, but it is believed that exposing the nitrogen-doped diamond-like carbon film to hydrogen radicals leads to selective etching of $sp^2$ hybridized carbon atoms thus increasing the $sp^3$ hybridized carbon atom fraction of the film, thus increasing the etch selectivity.

At operation 350, after the nitrogen-doped diamond-like carbon film 412 is formed on the substrate, the substrate is de-chucked. During operation 350, the chucking voltage is turned-off. The reactive gases are turned-off and optionally purged from the processing chamber. In one or more embodiments, the RF power is reduced (e.g., about 200 watt) during operation 350. Optionally, the controller 110 monitors impedance change to determine whether electrostatic charges are dissipated to ground through the RF path. Once the substrate is de-chucked from the electrostatic chuck, the remaining gases are purged from the processing chamber. The processing chamber is pumped down and the substrate is moved up on the lift pins and transferred out of chamber.

Figure 5:
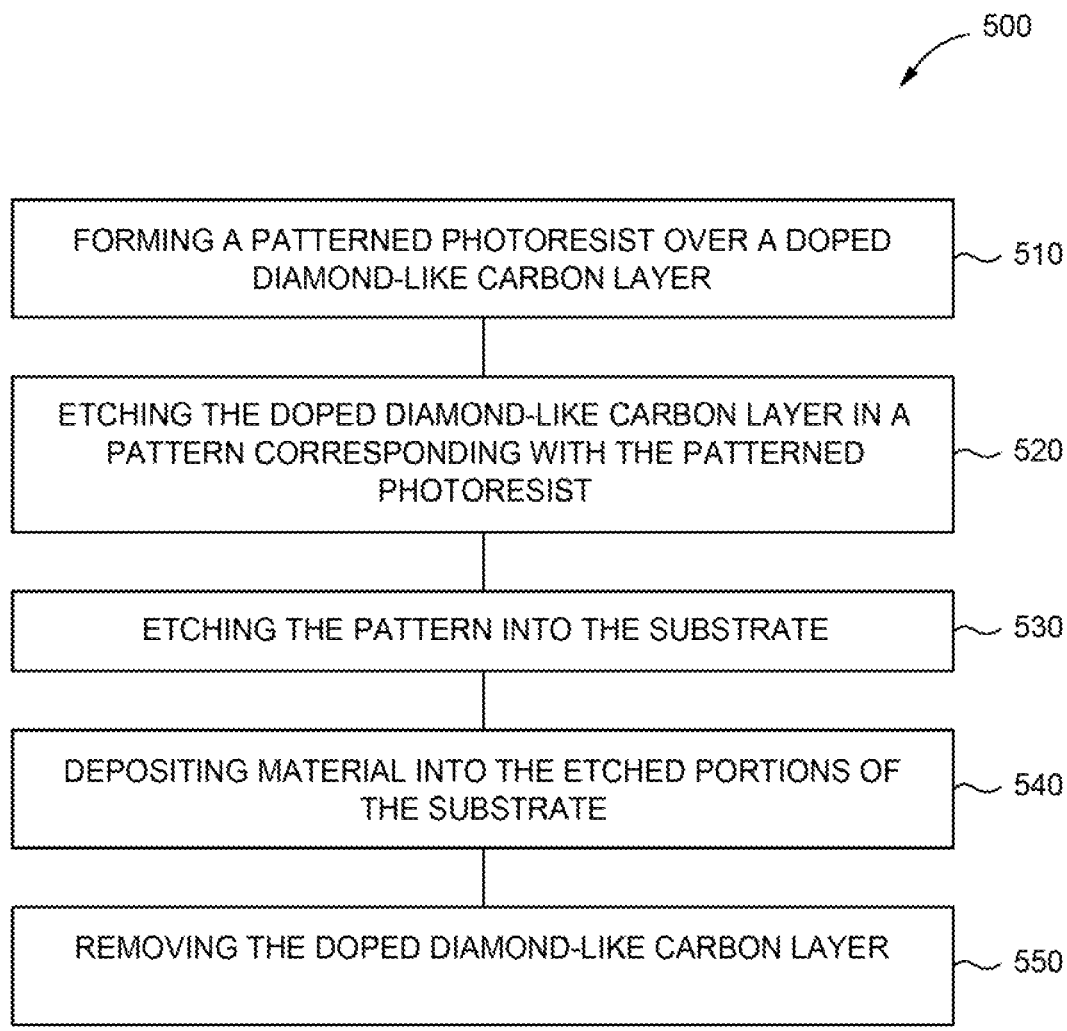
FIG. 5 depicts a flow diagram of a method of using a nitrogen-doped diamond-like carbon film according to one or more embodiments described and discussed herein.

FIG. 5 depicts a flow diagram of a method 500 of using a nitrogen-doped diamond-like carbon film in accordance with one or more embodiments described and discussed herein. After the nitrogen-doped diamond-like carbon film 412 is formed on the substrate, the nitrogen-doped diamond-like carbon film 412 may be utilized in an etching process as a patterning mask to form a three-dimensional structure, such as a stair like structure. The nitrogen-doped diamond-like carbon film 412 may be patterned using a standard photoresist patterning techniques. At operation 510, a patterned photoresist (not shown) may be formed over the nitrogen-doped diamond-like carbon film 412. At operation 520, the nitrogen-doped diamond-like carbon film 412 may be etched in a pattern corresponding with the patterned photoresist layer followed by etching the pattern into the substrate 402 at operation 530. At operation 540, material may be deposited into the etched portions of the substrate 402. At operation 550, the nitrogen-doped diamond-like carbon film 412 may be removed using a solution containing hydrogen peroxide and sulfuric acid. One exemplary solution containing hydrogen peroxide and sulfuric acid is known as Piranha solution or Piranha etch. The nitrogen-doped diamond-like carbon film 412 may also be removed using etch chemistries containing oxygen and halogens (e.g., fluorine or chlorine), for example, $Cl_2/O_2$, $CF_4/O_2$, $Cl_2/O_2/CF_4$. The nitrogen-doped diamond-like carbon film 412 may be removed by a chemical mechanical polishing (CMP) process.

Extreme Ultraviolet ("EUV") Patterning Schemes

The choice of underlayer is critical to preventing nano-failures (e.g., bridging defects and spacing defects) in semiconductor devices when using metal-containing photoresists in extreme ultraviolet ("EUV") patterning schemes. Conventional underlayers for EUV patterning (lithography) schemes are spin on carbon (SOC) materials. However, during patterning, metals such as tin, for example, diffuse through the SOC material leading to nanofailures in the semiconductor devices. Such nanofailures act to reduce, degrade, and hamper semiconductor performance.

The high-density carbon films described herein, on the other hand, have superior film qualities such as improved hardness and density. Such hardness and density allow the high-density carbon film to act as a stronger barrier against metal infiltration and to prevent and at a minimum, reduce nanofailures to a greater extent than the conventional SOC films. In one or more embodiments, a nitrogen-doped diamond-like carbon film for use as an underlayer for an extreme ultraviolet ("EUV") lithography process is provided.

In one or more embodiments, a nitrogen-doped diamond-like carbon film for use as an underlayer for an EUV lithography process can be any film described herein. The nitrogen-doped diamond-like carbon film can have an $sp^3$ hybridized carbon atom content of about 40% to about 90% based on the total amount of carbon atoms in the nitrogen-doped diamond-like carbon film, a compressive stress of about −20 MPa to less than −600 MPa, about −150 MPa to less than −600 MPa, or about −200 MPa to less than −600 MPa, such as about −225 MPa to about −500 MPa or about −250 MPa to about −400 MPa, an elastic modulus of greater than 60 GPa to about 200 GPa or greater than 60 GPa to about 150 GPa, and a density of greater than 1.5 g/cc to about 2.1 g/cc, such as about 1.55 g/cc to less than 2 g/cc, for example, about 1.6 g/cc to about 1.8 g/cc, about 1.65 g/cc to about 1.75 g/cc, or about 1.68 g/cc to about 1.72 g/cc.

Thus, methods and apparatuses for forming a hardmask layer, which is or contains a nitrogen-doped diamond-like carbon film, which may be utilized to form stair-like structures for manufacturing three-dimensional stacking of semiconductor devices are provided. By utilization of the nitrogen-doped diamond-like carbon film as a hardmask layer with desired robust film properties and etching selectivity, an improved dimension and profile control of the resultant structures formed in a film stack may be obtained and the electrical performance of the chip devices may be enhanced in applications for three-dimensional stacking of semiconductor devices.

In summary, some of the benefits of the present disclosure provide a process for depositing or otherwise forming nitrogen-doped diamond-like carbon films on a substrate. Typical PE-CVD hardmask films have a very low percent of hybridized $sp^3$ atoms and hence low modulus and etch selectivity. In some embodiments described herein, low process pressures (less than 1 Torr) and bottom driven plasma enables fabrication of doped films with about 60% or greater hybridized $sp^3$ atoms, which results in an improvement in etch selectivity relative to previously available hardmask films. In addition, some of the embodiments described herein are performed at low substrate temperatures, which enable the deposition of other dielectric films at much lower temperatures than currently possible, opening up applications with low thermal budget that could not be currently addressed by CVD. Additionally, some of the embodiments described herein may be used as an underlayer for an EUV lithography process.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

The invention claimed is:

1. A method of processing a substrate, comprising:
flowing a deposition gas comprising a hydrocarbon compound and a nitrogen dopant compound into a processing volume of a process chamber having a substrate positioned on an electrostatic chuck, wherein the nitrogen dopant compound comprises ammonia, hydrazine, methylhydrazine, dimethlyhydrazine, t-butylhydrazine, phenylhydrazine, azoisobutane, ethylazide, pyridine, derivatives thereof, abducts thereof, or any combination thereof; and generating a plasma above the substrate by applying a first RF bias to the electrostatic chuck to deposit a nitrogen-doped diamond-like carbon film on the substrate, wherein:
the nitrogen-doped diamond-like carbon film comprises about 0.05 atomic percent to 7 atomic percent of nitrogen, and
the nitrogen-doped diamond-like carbon film has a density of greater than 1.5 g/cc and a compressive stress of about −20 MPa to less than −600 MPa.

2. The method of claim 1, wherein the nitrogen-doped diamond-like carbon film has a compressive stress of about −250 MPa to about −400 MPa.

3. The method of claim 1, wherein the nitrogen-doped diamond-like carbon film has an elastic modulus of greater than 60 GPa to about 200 GPa.

4. The method of claim 1, wherein the nitrogen-doped diamond-like carbon film has a density of about 1.55 g/cc to less than 2 g/cc.

5. The method of claim 1, wherein the nitrogen dopant compound is flowed into the processing volume at a rate of about 10 sccm to about 1,000 sccm.

6. The method of claim 1, wherein the processing volume is maintained at a pressure of about 0.5 mTorr to about 10 Torr when generating the plasma and depositing the nitrogen-doped diamond-like carbon film on the substrate.

7. The method of claim 6, wherein the processing volume is maintained at a pressure of about 5 mTorr to about 100 mTorr, and wherein the substrate is maintained at a temperature of about 0° C. to about 50° C.

8. The method of claim 1, wherein the nitrogen-doped diamond-like carbon film comprises about 0.1 atomic percent to about 5 atomic percent of nitrogen.

9. The method of claim 1, wherein the nitrogen-doped diamond-like carbon film comprises about 50 atomic percent to about 90 atomic percent of $sp^3$ hybridized carbon atoms.

10. The method of claim 1, wherein the hydrocarbon compound comprises ethyne, propene, methane, butene, 1,3-dimethyladamantane, bicyclo[2.2.1]hepta-2,5-diene, adamantine, norbornene, or any combination thereof.

11. The method of claim 1, wherein the deposition gas further comprises helium, argon, xenon, neon, hydrogen ($H_2$), or any combination thereof.

12. The method of claim 1, wherein generating the plasma at the substrate further comprises applying a second RF bias to the electrostatic chuck.

13. The method of claim 12, wherein the electrostatic chuck has a chucking electrode and an RF electrode separate from the chucking electrode, and wherein the first RF bias is applied to the RF electrode and the second RF bias is applied to the chucking electrode.

14. The method of claim 12, wherein the first RF bias is provided at a power of about 10 watts to about 3,000 watts at a frequency of about 350 KHz to about 100 MHz, and wherein the second RF bias is provided at a power of about 10 watts to about 3,000 watts at a frequency of about 350 KHz to about 100 MHz.

15. A method of processing a substrate, comprising:
flowing a deposition gas comprising a hydrocarbon compound and a nitrogen dopant compound into a processing volume of a process chamber having a substrate positioned on an electrostatic chuck, wherein:
the nitrogen dopant compound comprises ammonia, hydrazine, methylhydrazine, dimethlyhydrazine, t-butylhydrazine, phenylhydrazine, azoisobutane, ethylazide, pyridine, derivatives thereof, abducts thereof, or any combination thereof,
the electrostatic chuck has a chucking electrode and an RF electrode separate from the chucking electrode, and
the processing volume is maintained at a pressure of about 0.5 mTorr to about 10 Torr; and
generating a plasma above the substrate by applying a first RF bias to the RF electrode and a second RF bias to the chucking electrode to deposit a nitrogen-doped diamond-like carbon film on the substrate, wherein the nitrogen-doped diamond-like carbon film comprises about 0.1 atomic percent to about 6 atomic percent of nitrogen and about 50 atomic percent to about 90 atomic percent of $sp^3$ hybridized carbon atoms, and has a density of greater than 1.5 g/cc and a compressive stress of about −20 MPa to less than −600 MPa.

16. The method of claim 15, wherein the nitrogen-doped diamond-like carbon film comprises about 55 atomic percent to about 75 atomic percent of $sp^3$ hybridized carbon atoms.

17. The method of claim 15, wherein the nitrogen-doped diamond-like carbon film has a density of about 1.55 g/cc to less than 2 g/cc, a compressive stress of about −250 MPa to about −400 MPa, and an elastic modulus of greater than 60 GPa to about 200 GPa.

18. A method of processing a substrate, comprising:
flowing a deposition gas comprising a hydrocarbon compound and a nitrogen dopant compound into a processing volume of a process chamber having a substrate positioned on an electrostatic chuck, wherein the electrostatic chuck has a chucking electrode and an RF electrode separate from the chucking electrode, and wherein the processing volume is maintained at a pressure of about 0.5 mTorr to about 10 Torr;
generating a plasma above the substrate by applying a first RF bias to the RF electrode and a second RF bias to the chucking electrode to deposit a nitrogen-doped diamond-like carbon film on the substrate, wherein the nitrogen-doped diamond-like carbon film comprises about 0.05 atomic percent to about 6 atomic percent of nitrogen, and has a density of greater than 1.5 g/cc and a compressive stress of about −20 MPa to less than −600 MPa;
forming a patterned photoresist layer over the nitrogen-doped diamond-like carbon film;
etching the nitrogen-doped diamond-like carbon film in a pattern corresponding with the patterned photoresist layer; and
etching the pattern into the substrate.

19. The method of claim 18, wherein the nitrogen-doped diamond-like carbon film comprises about 0.1 atomic percent to about 5 atomic percent of nitrogen.

20. The method of claim 18, wherein the nitrogen dopant compound comprises ammonia, hydrazine, methylhydrazine, dimethlyhydrazine, t-butylhydrazine, phenylhydrazine, azoisobutane, ethylazide, pyridine, derivatives thereof, abducts thereof, or any combination thereof.

* * * * *